US008993892B2

(12) United States Patent
Yamashita

(10) Patent No.: US 8,993,892 B2
(45) Date of Patent: Mar. 31, 2015

(54) WIRING BOARD AND METHOD OF MANUFACTURING THE WIRING BOARD

(75) Inventor: Toru Yamashita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 268 days.

(21) Appl. No.: 13/353,527

(22) Filed: Jan. 19, 2012

(65) Prior Publication Data

US 2012/0186859 A1 Jul. 26, 2012

(30) Foreign Application Priority Data

Jan. 24, 2011 (JP) ................... 2011-011902

(51) Int. Cl.

| H05K 1/00 | (2006.01) |
|---|---|
| B05D 5/12 | (2006.01) |
| H05K 1/11 | (2006.01) |
| H05K 3/28 | (2006.01) |
| H05K 1/03 | (2006.01) |
| H05K 3/46 | (2006.01) |

(Continued)

(52) U.S. Cl.
CPC .............. *H05K 1/118* (2013.01); *H05K 1/0393* (2013.01); *H05K 3/4691* (2013.01); *H05K 1/028* (2013.01); *H05K 1/189* (2013.01); *H05K 3/28* (2013.01); *H05K 3/361* (2013.01); *H05K 2201/09481* (2013.01); *H05K 2201/0969* (2013.01); *H05K 2201/099* (2013.01)
USPC ......................................... 174/254; 427/96.1

(58) Field of Classification Search
CPC ..... H05K 1/0393; H05K 1/189; H05K 1/028; H05K 3/4691; H05K 3/361

USPC ........................................ 174/254; 427/96.1
See application file for complete search history.

(56) References Cited

U.S. PATENT DOCUMENTS

| 2006/0170738 A1* | 8/2006 | Kato ............................... 347/72 |
| 2007/0182787 A1* | 8/2007 | Kubo et al. ..................... 347/58 |

(Continued)

FOREIGN PATENT DOCUMENTS

| JP | 2002-185141 A | 6/2002 |
| JP | 2004-140308 A | 5/2004 |

(Continued)

OTHER PUBLICATIONS

Japan Patent Office, Notification of Reason for Refusal for Japanese Patent Application No. 2011-011902 (counterpart Japanese patent application), mailed Mar. 12, 2013.

*Primary Examiner* — Timothy Thompson
*Assistant Examiner* — Rhadames J Alonzo Miller
(74) *Attorney, Agent, or Firm* — Baker Botts L.L.P.

(57) ABSTRACT

A wiring board includes: a substrate; first connection electrode portions which are disposed on a surface of the substrate and which are to be connected to individual-electrode connection terminals of an actuator via first bumps; first wires having electrical continuity with the first connection electrode portions; a second connecting electrode portion which is disposed on the surface of the substrate and which is to be connected to the a common-electrode connection terminal of the actuator via a second bump; and a second wire having electrical continuity with the second connection electrode portion. The second connecting electrode portion is located in an edge portion of the substrate. The second wire has a conducive-material absent portion that is located between an edge of the substrate and the second connecting electrode portion.

16 Claims, 10 Drawing Sheets

(51) Int. Cl.
*H05K 1/02* (2006.01)
*H05K 1/18* (2006.01)
*H05K 3/36* (2006.01)

(56) References Cited

U.S. PATENT DOCUMENTS

2008/0007140 A1* 1/2008 Izumi et al. .................... 310/317
2008/0030548 A1* 2/2008 Kubo .............................. 347/50
2008/0111859 A1* 5/2008 Kondo ............................ 347/50
2008/0316273 A1* 12/2008 Yamashita ..................... 347/50
2010/0128075 A1* 5/2010 Yamashita ....................... 347/9
2011/0181643 A1* 7/2011 Yamashita ...................... 347/10
2011/0240762 A1* 10/2011 Suzuki et al. ................. 239/289
2012/0067624 A1* 3/2012 Kubo et al. .................... 174/254

FOREIGN PATENT DOCUMENTS

| JP | 2005-197001 | A | | 7/2005 |
| JP | 2009-004687 | A | | 1/2009 |
| JP | 2009004687 | A | * | 1/2009 |
| JP | 2010-129873 | A | | 6/2010 |
| JP | 2010129873 | A | * | 6/2010 |

* cited by examiner

WIRING BOARD AND METHOD OF MANUFACTURING THE WIRING BOARD

CROSS REFERENCE TO RELATED APPLICATION

This application claims priority from Japanese Patent Applications No. 2011-011902 filed on Jan. 24, 2011, the disclosure of which is herein incorporated by reference in their entirety.

BACKGROUND OF THE INVENTION

Field of the Invention

The present invention relates to a wiring board and a process of manufacturing the wiring board.

In various technical fields, conventionally, a flexible wiring board has been used to be connected to electrodes and connection terminals that are disposed on an actuator, for supply of an electric power to the actuator and transmission/reception of control signals to/from the actuator. Conventionally, a solder has been widely used for connection of the flexible wiring board with the actuator. However, there is also a case where, in place of the solder, a conductive adhesive consisting of a thermosetting resin containing conductive particles is used for the connection.

There is known a technique of employing a heat pressing process, for connecting electrodes disposed on a surface of a plasma display panel (as a kind of actuator), with connection terminals of a flexible wiring board via a bump made of a conductive adhesive, wherein the flexible wiring board is coated at its terminal surface (i.e., a connection surface at which the wiring board is to be connected with the plasma display panel) with an insulating layer (e.g., a cover layer, a solder resist or the like) that covers a wiring pattern except the connection terminals.

SUMMARY OF THE INVENTION

In connection of the wiring board with the actuator via the bump, it is common that the bump made of the conductive adhesive is caused to shrink when being hardened by heat, and that a portion of the board positioned in the vicinity of the bump is deformed to be drawn toward the actuator as a result of the hardening shrinkage of the bump.

The flexible wiring board has an insulating layer that is provided for covering a connection surface of a substrate at which the wiring board is to be connected to the actuator. The insulating layer is formed by applying an insulating material, commonly, such that the formed insulating layer is controlled to have a constant thickness. However, it is difficult to control the thickness of the formed insulating layer, particularly, in an edge portion of the substrate. In formation of the insulating layer, as shown in FIG. 10, the thickness of the insulating layer 102 is likely to be larger in the edge portion of the substrate 101, than in a central portion of the substrate 101 (which is located on a right side of a bump 104 as seen in FIG. 10). Under such a situation, where a connection terminal 103, which is to be connected to the actuator 100 via the bump 104, is provided in the edge portion of the substrate 100, there is a problem that a large thickness portion of the insulating layer 102 could interfere with the actuator 100 when the flexible substrate 101 is deformed toward the actuator 100 as a result of the hardening shrinkage of the bump 104. Consequently, the deformation of the substrate 101 is impeded whereby a large force is caused to act on the bump 104, thereby inducing a risk of connection failure due to possible breakage of the bump 104.

It is therefore an object of the invention to prevent occurrence of the connection failure in the edge portion of the substrate by restraining increase of the thickness of the insulating layer in the edge portion of the substrate.

The above object of the invention may be achieved according to a first aspect of the invention, which provides a wiring board to be connected to a plurality of individual-electrode connection terminals and at least one common-electrode connection terminal that are disposed on a surface of an actuator having a plurality of individual electrodes and at least one common electrode. The plurality of individual-electrode connection terminals are provided for the respective individual electrodes. The at least one common-electrode connection terminal is provided for the at least one common electrode. The wiring board includes: (a) a flexible substrate which has an opposed surface that is to be opposed to the surface of the actuator, and which is made of an insulating material; (b) a plurality of first connection electrode portions which are disposed on the opposed surface of the flexible substrate, and which are to be connected to the plurality of individual-electrode connection terminals of the actuator via first bumps each made of a conductive adhesive; (c) a plurality of first wires each of which is made of a conductive material and which have electrical continuity with the plurality of first connection electrode portions; (d) at least one second connecting electrode portion which is disposed on the opposed surface of the flexible substrate, and which is to be connected to the at least one common-electrode connection terminal of the actuator via at least one second bump each made of a conductive adhesive; and (e) a second wire which is made of a conductive material. The second wire has electrical continuity with the at least one second connecting electrode portion and includes a large width portion having a width larger than a width of each of the first wires. The at least one second connecting electrode portion is provided in the large width portion of the second wire, such that the at least one second connecting electrode portion and the large width portion are located in an edge portion of the flexible substrate. The opposed surface of the flexible substrate is coated with an insulating layer, such that the plurality of first wires and the second wire are covered by the insulating layer, and such that the plurality of first connection electrode portions and the at least one second connecting electrode portion are exposed from the insulating layer. The large width portion of the second wire has a conducive-material absent portion in which the conductive material constituting the large width portion is absent, such that the conducive-material absent portion is located between an edge of the flexible substrate and at least one of the at least one second connecting electrode portion.

The above object of the invention may be achieved according to a second aspect of the invention, which provides a process of manufacturing a wiring board to be connected to a plurality of individual-electrode connection terminals and at least one common-electrode connection terminal that are disposed on a surface of an actuator having a plurality of individual electrodes and at least one common electrode. The plurality of individual-electrode connection terminals are provided for the respective individual electrodes. The at least one common-electrode connection terminal is provided for the at least one common electrode. This manufacturing process includes: (a) forming a plurality of first connection electrode portions and a plurality of first wires, onto a surface of a flexible substrate that is made of an insulating material, such that the plurality of first connection electrode portions are to be connected to the plurality of individual-electrode connection terminals of the actuator via first bumps each made of a conductive adhesive, and such that the plurality of first wires have electrical continuity with the plurality of first connection electrode portions; (b) forming at least one second connecting electrode portion and a second wire, onto the surface of the flexible substrate, such that the at least one second connecting electrode portion is to be connected to the at least one common-electrode connection terminal of the actuator via at least one second bump each made of a conductive adhesive, such that the second wire has electrical continuity with the at least one second connecting electrode portion and includes a large width portion having a width larger than a width of each of the first wires, such that the at least one second connecting electrode portion is provided in the large width portion of the second wire, such that the at least one second connecting electrode portion and the large width portion are located in an edge portion of the flexible substrate, such that the large width portion of the second wire has a conducive-material absent portion in which a conductive material constituting the large width portion is absent, and such that the conducive-material absent portion is located between an edge of the flexible substrate and at least one of the at least one second connecting electrode portion; and (c) coating the surface of the flexible substrate with an insulating layer, by applying an insulating material onto the opposed surface after the plurality of first connection electrode portions, the plurality of first wires, the at least one second connecting electrode portion and the second wire have been formed on the surface of the flexible substrate, such that the plurality of first wires and the second wire are covered by the insulating layer, and such that the plurality of first connection electrode portions and the at least one second connecting electrode portion are exposed from the insulating layer.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE EMBODIMENT

There will be described embodiment of the present invention. The present embodiment is an example of an inkjet printer to which the present invention is applied. This inkjet printer has an inkjet head configured to eject ink droplets toward a recording sheet.

Figure 1:
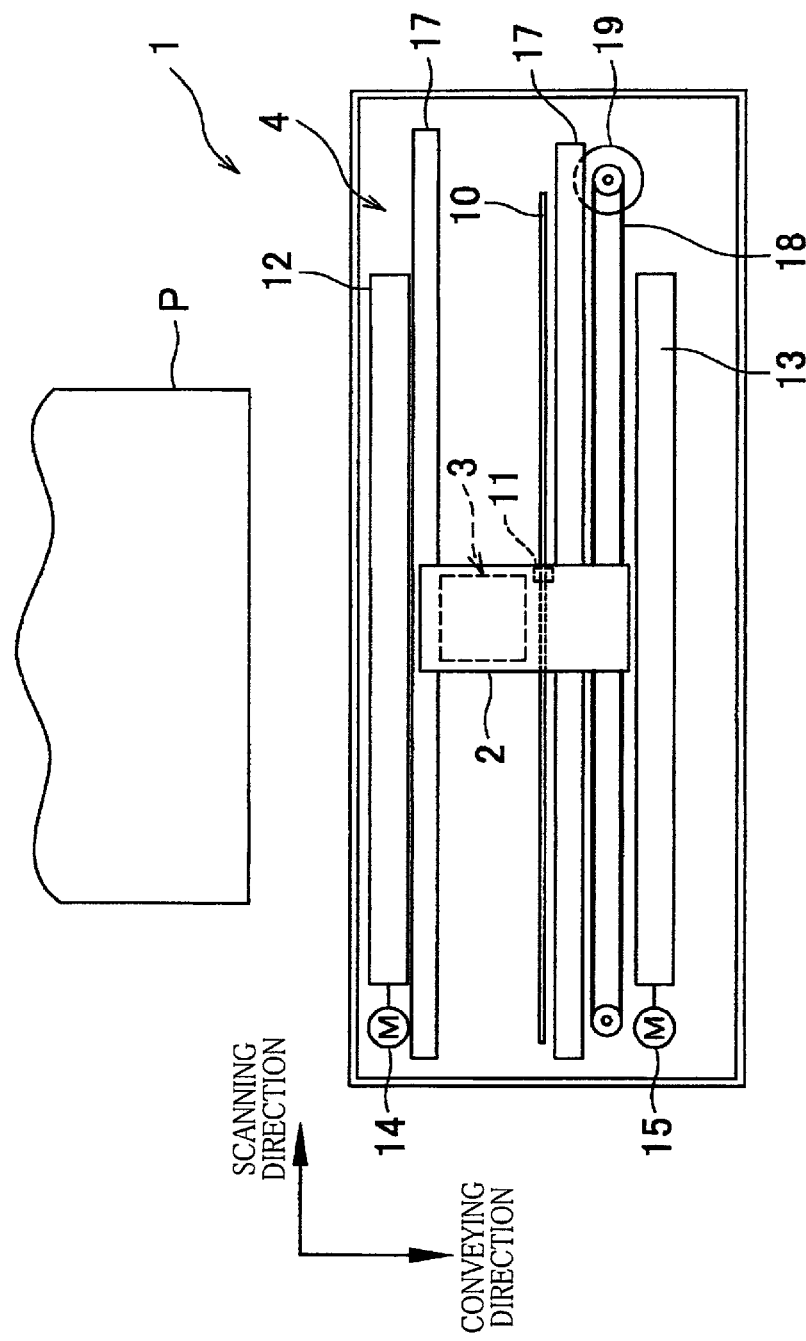
FIG. 1 is a plan view schematically showing an inkjet printer constructed according to an embodiment of the invention.

Firstly, an overall construction of the inkjet printer 1 of the embodiment will be described. As shown in FIG. 1, the printer 1 has a carriage 2 that is reciprocatable in a scanning direction (that is parallel to right and left directions in FIG. 1), an inkjet head 3 carried on the carriage 2, and a conveying mechanism 4 configured to convey a recording sheet P in a conveying direction that is perpendicular to the scanning direction.

The carriage 2 is reciprocatable in the scanning direction along two guide rods 17 that extend in parallel with the scanning direction. An endless belt 18 is attached to the carriage 2, and is to be circulated by a carriage drive motor 19 whereby the carriage 2 can be moved in the scanning direction by the circulation of the endless belt. The printer 1 is provided with a linear encoder 10 having a multiplicity of light transmitting portions (slits) that are arranged in the scanning direction with a given interval distance between each adjacent pair of the light transmitting portions. The carriage 2 is provided with a transmissive-type photosensor 11 having a light emitting element and a right receiving element. In the printer 1, it is possible to recognize a current position of the carriage 2 in the scanning direction, based on a counted value (number of detection) of the light transmitting portions of the linear encoder 10 that has been detected by the photosensor 11 during movement of the carriage 2.

The carriage 2 carries the inkjet head 3 having a multiplicity of nozzles 30 (see FIGS. 2-5) that open in its lower surface (i.e., a surface facing a back side of the drawing sheet of FIG. 1). The inkjet head 3 is configured to eject inks (supplied from ink cartridges not shown) through the multiplicity of nozzles 30 onto the recording sheet P that is to conveyed by the conveying mechanism 4 in the conveying direction (i.e., in a downward direction as seen in FIG. 1).

The conveying mechanism 4 has a sheet supplying roller 12 and a sheet discharging roller 13, which are disposed on upstream and downstream sides of the inkjet head 3, respectively, in the conveying direction. The sheet supplying roller 12 and the sheet discharging roller 13 are to be rotated by a sheet supplying motor 14 and a sheet discharging motor 15, respectively. The conveying mechanism 4 is configured to convey the recording sheet P, by rotation of the sheet supplying roller 12, to the inkjet head 3 from an upper side of the inkjet head 3 as seen in FIG. 1, and to discharge the recording sheet P (on which image, character or the like has been already recorded by the inkjet head 3), by rotation of the sheet discharging roller 13, toward a lower side of the inkjet head as seen in FIG. 1.

Referring next to FIGS. 2-5, the inkjet head 3 will be described. The inkjet head 3 has an ink channel unit 6 and a piezoelectric actuator 8. The ink channel unit 6 defines therein ink channels containing the nozzles 30 and pressure chambers 24. The piezoelectric actuator 8 is provided for pressurizing ink within each of the pressure chambers 24. Further, as shown in FIGS. 2-5, a flexible print wiring board (FPC) 48 is connected to an upper surface of the piezoelectric actuator 8. It is noted that, in FIGS. 2 and 3, the FPC 48, which is disposed to cover an upper surface of the inkjet head 3, is represented by two-dot chain line (imaginary line), for easier understanding.

Figure 2:
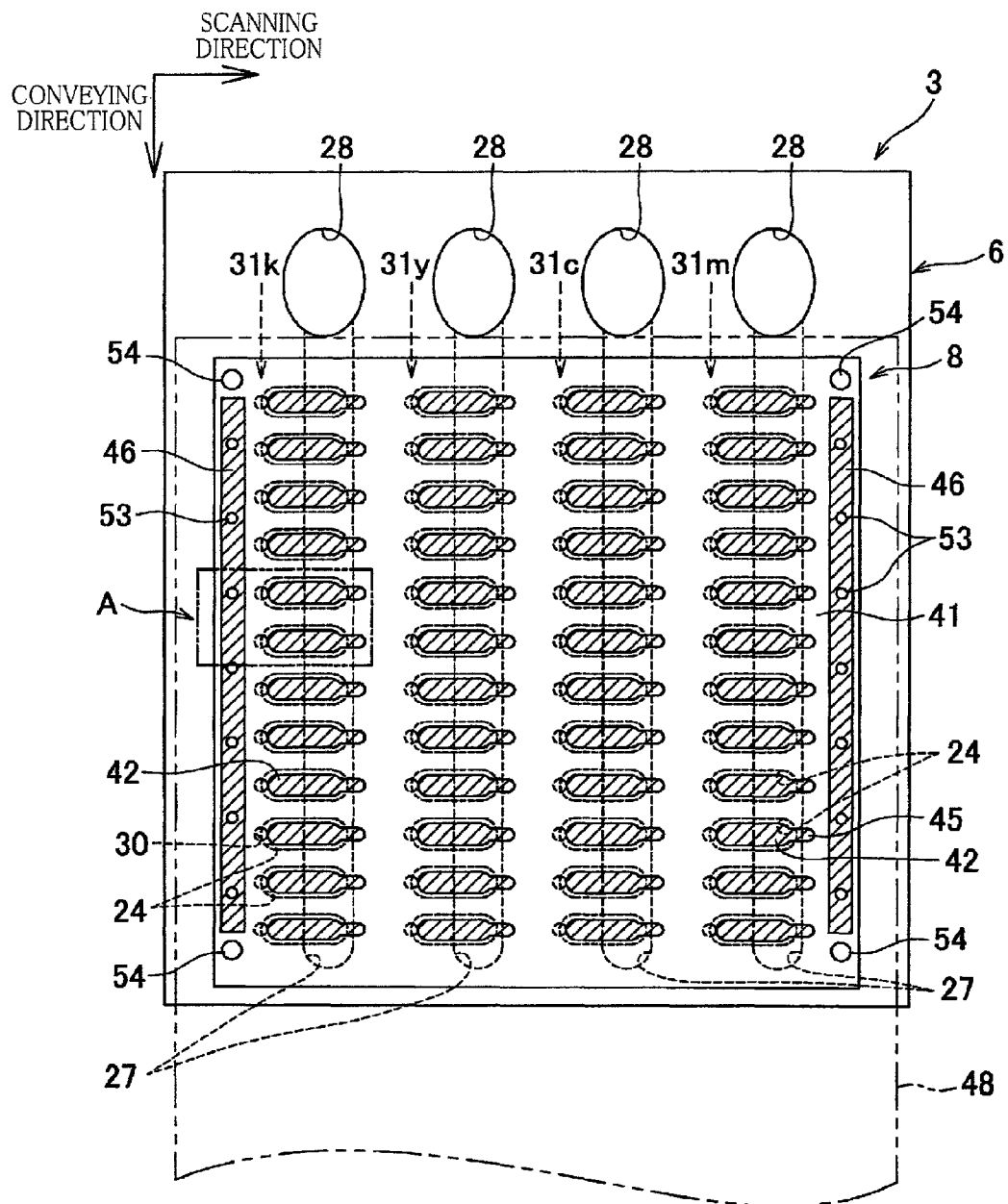
FIG. 2 is a plan view showing an inkjet head of the printer of FIG. 1.
Figure 4:
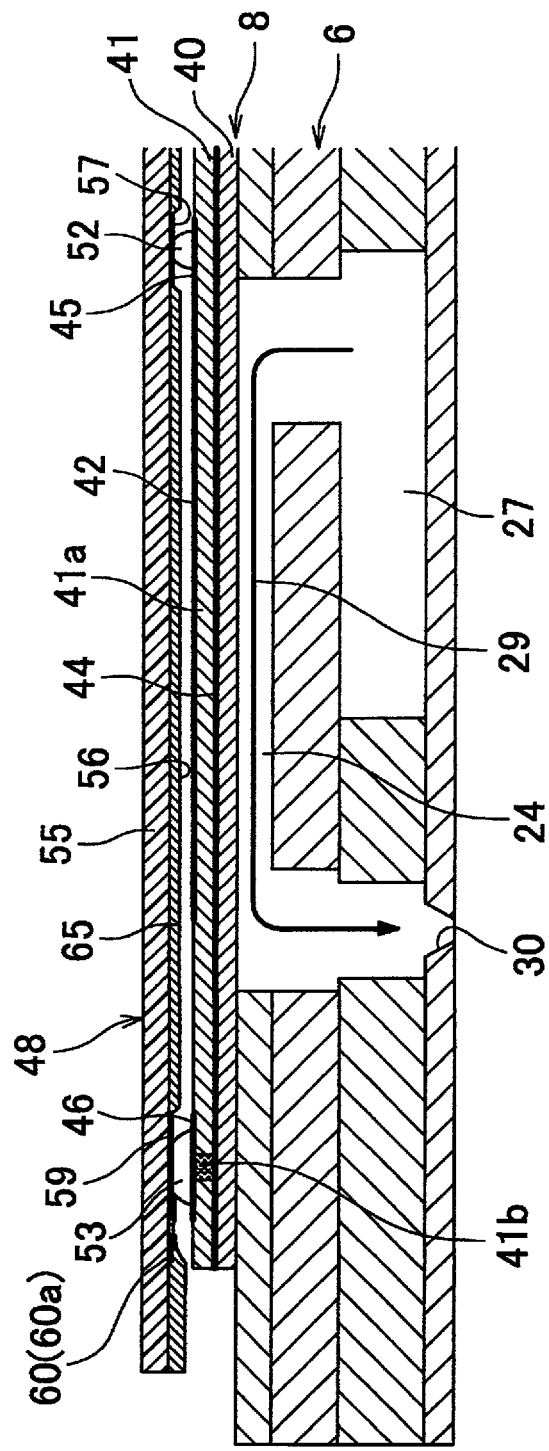
FIG. 4 is a cross sectional view taken along line IV-IV in FIG. 3.
Figure 5:
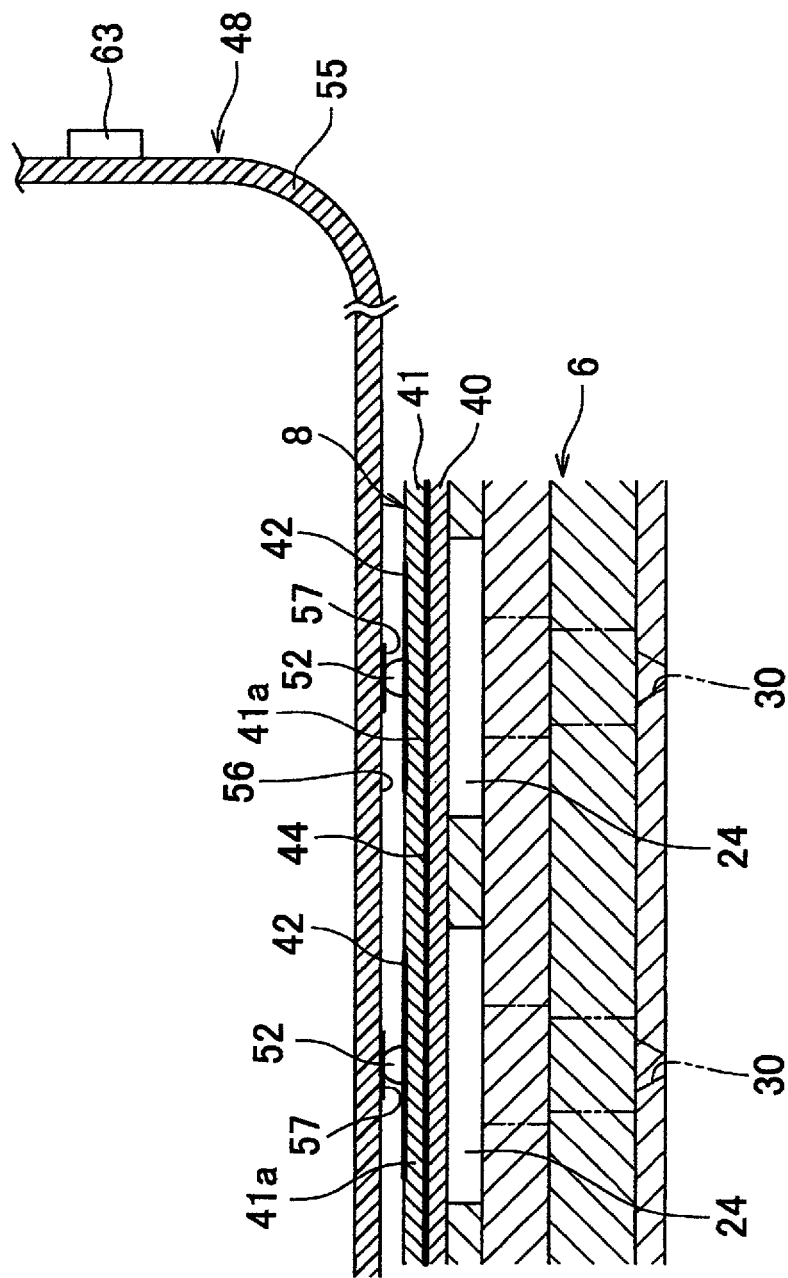
FIG. 5 is a cross sectional view taken along line V-V in FIG. 3.

As shown in FIGS. 4 and 5, the ink channel unit 6 is constituted by four plates that are stacked on one another, and defines therein the ink channels. The multiplicity of nozzles 30 open in a lower surface (i.e., a surface facing a back side of the drawing sheet of FIG. 2) of the ink channel unit 6. As shown in FIG. 2, the nozzles 30 are arranged in four rows 31 (31$k$, 31$y$, 31$c$, 31$m$) each extending in the conveying direction. The four rows 31 are arranged in the scanning direction. The nozzles 30 of the row 31$k$ are assigned to eject black ink therethrough. The nozzles 30 of the row 31$y$ are assigned to eject yellow ink therethrough. The nozzles 30 of the row 31$c$ are assigned to eject cyan ink therethrough. The nozzles 30 of the row 31$m$ are assigned to eject magenta ink therethrough. The nozzles 30 are held in communication with the respective pressure chambers 24 that are also defined in the ink channel unit 6. Like the nozzles 30, the pressure chambers 24 are arranged in four rows. The ink channel unit 6 further defines therein four manifold chambers 27 which are elongated in the conveying direction and which serve to deliver the respective four color inks (i.e., black, yellow, cyan and magenta inks) to the four rows of the pressure chambers 24. The four manifold chambers 27 are held in communication with respective four ink inlets 28 that are formed in the upper surface of the ink channel unit 6.

In the ink channel unit 6, as shown in FIG. 4, each manifold chamber 27, which is held in communication with the corresponding ink inlet 28, is held in communication with the pressure chambers 24 of the corresponding row which are held in communication with the nozzles 30 of the corresponding row 31. That is, the ink channel unit 6 defines therein a plurality of individual ink channels 29 each of which is constituted by the corresponding manifold chamber 27, pressure chamber 24 and nozzle 30.

Next, the piezoelectric actuator 8 will be described. As shown in FIGS. 2-5, the piezoelectric actuator 8 has two piezoelectric layers 40, 41, a plurality of individual electrodes 42 and a common electrode 44. The two piezoelectric layers 40, 41 are superposed on the upper surface of the ink channel unit 6 so as to cover the plurality of pressure chambers 24. The plurality of individual electrodes 42 are disposed on an upper surface of the upper piezoelectric layer 41. The common electrode 44 is interposed between the two piezoelectric layers 40, 41.

The two piezoelectric layers 40, 41 are made of a piezoelectric material whose main component is lead zirconate titanate (PZT), and have the same rectangular shape as seen in plan view. The PZT is a solid solution of lead titanate and lead zirconate, and constitutes a ferroelectric substance. The two piezoelectric layers 40, 41 are superposed on each other, and are fixed onto the upper surface of the ink channel unit 6, so as to cover the plurality of pressure chambers 24. In operation of the inkjet head 3, a predetermined level of polarization voltage is applied between each of the individual electrodes 42 and the common electrode 44, whereby a portion (hereinafter referred to as an active portion 41$a$ where appropriate) of the upper piezoelectric layer 41, which is sandwiched between each of the individual electrodes 35 and the common electrode 44, is polarized in its thickness direction.

Figure 3:
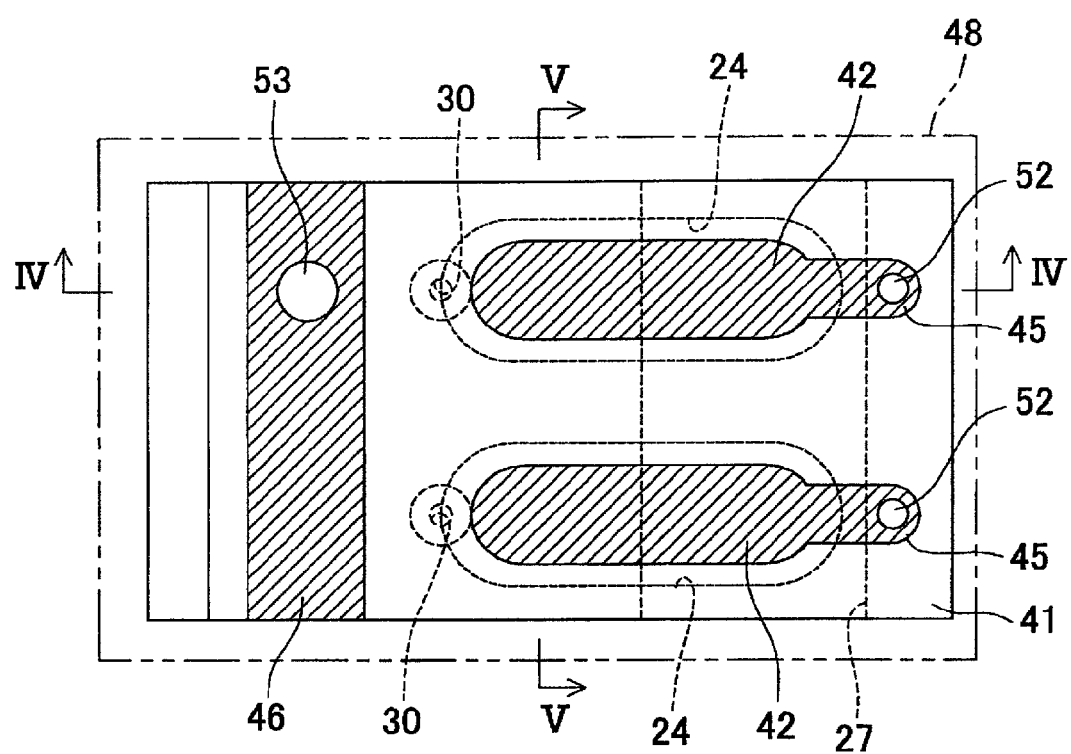
FIG. 3 is an enlarged view showing a part A in FIG. 2.

The plurality of individual electrodes 42 are disposed in the upper surface of the piezoelectric layer 41, and are located in respective positions opposed to the respective pressure chambers 24. As shown in FIGS. 2 and 3, each of the individual electrodes 42, having a substantially elliptic shape as seen in plan view, is slightly smaller than a corresponding one of the pressure chambers 24, and is substantially aligned with a central portion of the corresponding pressure chamber 24. Like the pressure chambers 24 held in communication with the respective nozzles 30, the individual electrodes 42 are arranged in four rows. A plurality of individual-electrode connection terminals 45 are provided to extend from end portions of the respective individual electrodes 42, in a longitudinal direction of the elliptic-shaped individual electrodes 42.

As shown in FIGS. 4 and 5, a plurality of bumps 52 as first bumps are provided on the respective individual-electrode connection terminals 45, so that the individual-electrode connection terminals 45 are connected to first connection electrode portions 57 of the FPC 48 (that is disposed to cover the upper surface of the piezoelectric actuator 8) via the bumps 52 each of which is made of a conductive adhesive. The conductive adhesive is constituted principally by a thermosetting resin such as epoxy resin and a multiplicity of conductive particles (e.g., silver (Ag) particles) dispersed in the thermosetting resin. By a heat pressing, the conductive adhesive is hardened and given a conductivity, and serves to mechanically interconnect two members and provide the two members with electrical continuity with each other. Further, as described later, in operation of the inkjet head 3, drive pulse signals are supplied to the plurality of individual electrodes 42 from a driver IC 63 (see FIG. 5) disposed on the FPC 48.

The common electrode 44 interposed between the two piezoelectric layers 40, 41 is formed to cover substantially the entirety of a lower surface of the upper piezoelectric layer 41 and substantially the entirety of an upper surface of the lower piezoelectric layer 40, so that the common electrode 44 is opposed to the plurality of individual electrodes 42, with the upper piezoelectric layer 41 being interposed between the common electrode 44 and the individual electrodes 42.

As shown in FIG. 2, two surface electrodes 46 as common-electrode connection terminals are provided on the upper surface of the upper piezoelectric layer 41 (i.e., the upper surface of the piezoelectric actuator 8). More precisely, each of the two surface electrodes 46 is disposed in a corresponding one of opposite end portions (i.e., edge portions) of the upper surface of the piezoelectric layer 41 which are opposite to each other in the scanning direction, and extends along a corresponding one of opposite edges of the upper surface of the piezoelectric layer 41 which are opposite to each other in the scanning direction. The upper piezoelectric layer 41 has a plurality of through-holes 41$b$ (one of which is shown in FIG. 4) in its opposite end portions on which the surface electrodes 46 are disposed, so that the surface electrodes 46 have electrical continuity with the common electrode 44 interposed between the two piezoelectric layers 40, 41, via a conductive material received in each of the through-holes 41$b$. Further, a plurality of bumps 53 as second bumps are provided on each of the two surface electrodes 46, are arranged in a longitudinal direction of each surface electrode 46 with a suitable interval distance between each adjacent two of the bumps 53, so that the surface electrode 46 is connected to second connecting electrode portions 59 of the FPC 48 via the bumps 53, as shown in FIG. 4. Each of the bumps 53 provided for the common electrode 44 is larger in size than each of the bumps 52 provided for the individual electrodes 42, and is made of a conductive adhesive like the bumps 52. It is noted that the common electrode 44 is connected via the FPC 48 to a ground wire of a control board (not shown) of the printer 1, so that an electric potential of the common electrode 44 is kept in ground level.

As shown in FIG. 2, four reinforcement bumps 54 as third bumps are disposed in respective four corner portions of the upper surface of the upper piezoelectric layer 41 having a rectangular shape as seen in plan view. Like the bumps 52 provided for the individual electrodes 42 and the bumps 53 provided for the common electrode 44, each of the four reinforcement bumps 54 is made of a conductive adhesive and is connected to the FPC 48. It is noted that the reinforcement bumps 54 are provided for the purpose of mechanically connecting the piezoelectric actuator 8 and the FPC 48, rather than providing the actuator 8 and the FPC 48 with electrical continuity with each other therethrough. Therefore, each of the reinforcement bumps 54 is disposed in a position adjacent to a corresponding one of the surface electrodes 46 (namely, disposed in a non-continuity portion of the upper surface of the actuator 8 which has no electrical continuity with the common electrode 44), but is not disposed on the corresponding surface electrode 46. Although the reinforcement bumps 54 may be disposed directly on the upper surface of the upper piezoelectric layer 41, the bumps 54 may be disposed on the upper surface of the piezoelectric layer 41 via dummy electrodes (i.e., electrodes which does not contribute to transmission of signals supplied to the piezoelectric actuator 8) which are isolated from the individual electrodes 42 and the surface electrodes 46, for establishing better adhesion of the bumps 54 to the upper surface of the piezoelectric actuator 8. Thus, owing to provision of the four reinforcement bumps 54 in addition to the bumps 52 provided for the individual electrodes 42 and the bumps 53 provided for the common electrode 44, it is possible to reinforce connection of the piezoelectric actuator 8 and the FPC 48 and to reliably prevent separation of the FPC 48 from the actuator 8. It is further noted that, for obtaining a high degree of reinforcement effect, namely, for increasing a strength of connection of the actuator 8 and the FPC 48, each of the reinforcement bumps 54 is much larger in size than each bump 52 (for the individual electrodes 42) and each bump 53 (for the common electrode 44) that are shown in FIGS. 2 and 3. Described more specifically, each reinforcement bump 54 has a contact surface which is to be held in contact with the corresponding third connecting electrode portion 62, and which is larger than a contact surface of each bump 52 and a contact surface of each bump 53 that are to be held in contact with the corresponding first connecting electrode portion 57 and the corresponding second connecting electrode portion 59, respectively.

Next, the FPC 48 will be described. As shown in FIGS. 2-5, the FPC 48, which is connected to the piezoelectric actuator 8, includes an opposed portion opposed to the upper surface of the piezoelectric actuator 8 and an extending portion extending from one of opposite end portions of the actuator 8 opposite to each other in a direction in which the nozzle rows 31 extend, namely, extending from a lower end portion of the actuator 8 as seen in FIG. 2. The extending portion of the FPC 48 extends horizontally from the actuator 8, and is bent to extend upwardly, as shown in FIG. 5.

Figure 6:
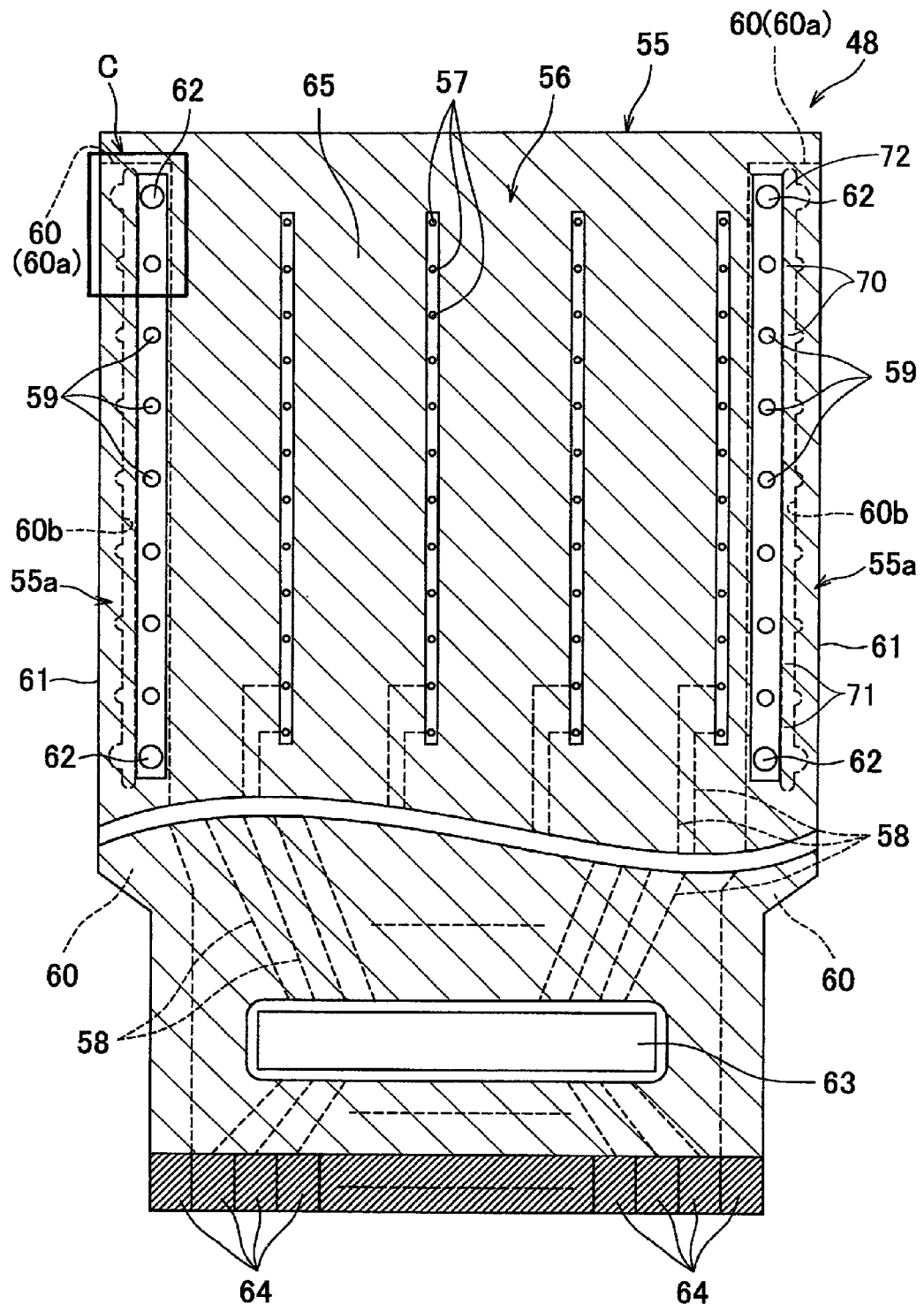
FIG. 6 is a plan view of FPC as seen from side of a connection surface of the FPC, at which the FPC is to be connected to a piezoelectric actuator.

FIG. 6 is a plan view of the FPC 48 as seen from side of its connection surface (opposed surface) 56 at which the FPC 48 is to be connected to the piezoelectric actuator 8. As shown in FIGS. 4-6, the FPC 48 has a flexible substrate 55, first connection electrode portions 57, first wires 58, second connecting electrode portions 59 and second wires 60. The flexible substrate 55 is made of an insulating material such as polyimide. The first connection electrode portions 57 are disposed on the connection surface 56 of the substrate 55 that is opposed to the upper surface of the piezoelectric actuator 8. The first wires 58 are provided to have electrical continuity with the respective first connection electrode portions 57. The second connecting electrode portions 59 are disposed on the connection surface 56 of the substrate 55. The second wires 60 are provided to have electrical continuity with the second connection electrode portions 59.

The first connection electrode portions 57 are to be connected to the respective individual electrodes 42 of the piezoelectric actuator 8 via the respective connection terminals 45 and the respective bumps 52 (see FIGS. 3-5). As shown in FIG. 6, the first connection electrode portions 57 are located in a central portion of the connection surface 56 of the substrate 55, and are arranged in four rows so as to be aligned with the respective individual-electrode connection terminals 45 of the piezoelectric actuator 8 that are also arranged in the four rows (see FIGS. 2 and 3). The first wires 58, which are connected to the respective first connection electrode portions 57, pass regions between the first connection electrode portions 57 and extend toward a proximal end of the substrate 55 (downwardly as seen in FIG. 6). In FIG. 6, only some of the first wires 58 are illustrated while most of the first wires 58 are not illustrated, for simplifying the entire illustration of FIG. 6.

The second connecting electrode portions 59 are to be connected to the common electrode 44 of the piezoelectric actuator 8 via the surface electrodes 46 and the respective bumps 53 (see FIGS. 2-4). As shown in FIG. 6, the second connecting electrode portions 59 are located in two edge portions 55a of the connection surface 56 of the substrate 55, and are arranged in two rows extending along respective two edges 61 of the substrate 55, with a suitable interval distance between each adjacent two of the second connecting electrode portions 59. The second connecting electrode portions 59 of each of the two rows are located in respective positions that are to be aligned with a corresponding one of the two surface electrodes 46 that are formed on respective two edge portions of the upper surface of the piezoelectric actuator 8. Described more specifically, each of the two second wires 60, which has a width considerably larger than a width of each first wire 58, is disposed on a corresponding one of the two edge portions 55a of the substrate 55. The two second wires 60 extend along the respective two edges 61 of the substrate 55, and extend further toward the proximal end of the substrate 55 (downwardly as seen in FIG. 6). The second wires 60 include distal end portions 60a (each corresponding to a large width portion) that are disposed on the connection surface 56 (at which the FPC 48 is to be connected to the piezoelectric actuator 8). The second connecting electrode portions 59, which are to be held in contact with the respective bumps 53, are disposed on the distal end portions 60a of the second wires 60, and are arranged along the edges 61 of the substrate 55, with a suitable interval distance between each adjacent two of the second connecting electrode portions 59. It is noted that the number of the second connecting electrode portion 59 may be only one, for simply establishing electrical continuity between the FPC 48 and the surface electrode 46 of the piezoelectric actuator 8. In the present embodiment, however, for the purpose of reliably establishing electrical continuity therebetween and reducing electrical resistance therebetween, the plurality of second electrode portions 59 are provided in the FPC 48 and are connected to the surface electrodes 46 of the actuator 8 via the bumps 53.

Further, as shown in FIG. 6, on the distal end portions 60a of the second wires 60, not only the second connecting electrode portions 59 but also third connecting electrode portions 62 are disposed. The third connecting electrode portions 62 are provided to be connected to the piezoelectric actuator 8 via the above-described reinforcement bumps 54 (see FIG. 2). The third connecting electrode portions 62 are disposed in respective four corner portions of the connection surface 56 that has a generally rectangular shape.

As shown in FIGS. 5 and 6, the driver IC 63 is disposed on the same surface as the connection surface 56 of the substrate 55 of the FPC 48. The driver IC 63 is connected at its input-side portion to a plurality of input terminals 64 that are formed on a proximal end portion of the substrate 55, so that various control signals are inputted to the driver IC 63 via the input terminals 64 from the control board (not shown) of the printer 1. The driver IC 63 is connected further at its output-side portion to the above-described plurality of first wires 58 that are provided for the respective individual electrodes 42 of the piezoelectric actuator 8. The driver IC 63 is configured to activate the actuator 8, based on control signals that are supplied from the control circuit (not shown) of the printer 1. Described specifically, the driver IC 63 is configured to supply drive signals having pulse waveforms, to selected ones of the plurality of individual electrodes 42, for thereby switching an electric potential of each individual electrode 42 between a ground level and a driving level that corresponds to an amplitude of the pulse waveform, so that an electric field is caused to act the polarized portion (i.e., active portion 41a shown in FIGS. 4 and 5) sandwiched between each individual electrode 35 and the common electrode 44, in the thickness direction, whereby the active portion 41a is piezoelectrically deformed.

The activation of the piezoelectric actuator 8 will be described more in detail. When the drive signal is supplied from the driver IC 63 to one of the individual electrodes 42 so as to apply the driving voltage between the same individual electrode 42 and the common electrode 44, a potential difference between the same individual electrode 42 and the common electrode 44 (whose electric potential is kept in ground level) is generated, whereby an electric field is caused to act the active portion 41a sandwiched therebetween, in the thickness direction. Since the direction of the electric field is parallel with the direction of the polarization of the upper piezoelectric layer 41, the active portion 41a is caused to shrink in a surface direction that is perpendicular to the thickness direction. Meanwhile, the electric field does not act on the lower piezoelectric layer 40 that is fixed onto the upper surface of the ink channel unit 6, a portion of the lower piezoelectric layer 40, which cover the corresponding pressure chambers 24, is deformed (i.e., unimorph deformation) to convex toward the pressure chamber 24, as a result of shrinkage of the upper piezoelectric layer 41 in the surface direction. In this instance, since a volume of the pressure chamber 24 is reduced, the ink stored in the pressure chamber 24 is pressurized whereby the ink is caused to eject via the nozzle 30 that is held in communication with the pressure chamber 24.

Further, as shown in FIG. 6, the connection surface 56 of the substrate 55 is coated with an insulating layer 65 for protecting the first and second wires 58, 60 and preventing shorting between the wires 58, 60. The insulating layer 65 is formed by applying a liquid insulating material (e.g., solder resist) in a direction substantially perpendicular or intersecting in a direction in which the edges 61 and the second wires 60 extend (i.e., in a direction substantially perpendicular or intersecting in a direction in which the second connecting electrode portions 59 of each of the two rows are arranged), such that almost the entirety of the connection surface 56 (except its portions in which the first connection electrode portions 57, second connecting electrode portions 59 and third connecting electrode portions 62 are disposed) is covered by the insulating layer 65. That is, a major portion of each of the first and second wires 58, 60 is covered with the insulating layer 65, while the first, second and third connection electrode portions 57, 59 and 62 are exposed from the insulating layer 65.

The common electrode 44 is opposed to the multiplicity of individual electrodes 42 so as to cooperate with the individual electrodes 42 to activate (piezoelectrically deform) the active portions 41a. When many of the active portions 41a are activated concurrently with one another, a large amount of driving current is caused to flow through the common electrode 44. In this instance, if an electrical resistance in the common electrode 44 were high, such a high electrical resistance could cause a delay in switching of the electric potential of each individual electrode 42 from the ground level to the driving level, or an instantaneous large change of the electric potential of the common electrode 44 which should be inherently kept constant (i.e., ground level), thereby fluctuating the pressure of the ink stored the corresponding pressure chamber 24 and accordingly affecting a droplet ejection characteristic of the corresponding nozzle 30. In view of such a possible problem, it is preferable to minimize the electrical resistance in the common electrode 44 and wires or the like connected to the common electrode 44. To this end, as shown in FIG. 6, each of the second wires 60 connected to the second connecting electrode portions 59 provided for the common electrode 44 has a width that is much larger than a width of each of the first wires 58 provided for the individual electrodes 42.

Further, if the second wires 60 each having a large width (i.e., large area) were disposed in a central portion of the connection surface 56 of the substrate 55, there could be limitation on wiring arrangement of the multiplicity of first wires 58. Therefore, the distal end portion 60a of each of the second wires 60 is disposed in a corresponding one of the edge portions 55a of the connection surface 56 of the substrate 55, for avoiding such a limitation, namely, for avoiding the arrangement of the first wires 58 from being interfered by the second wires 60 each having a large width.

Figure 10:
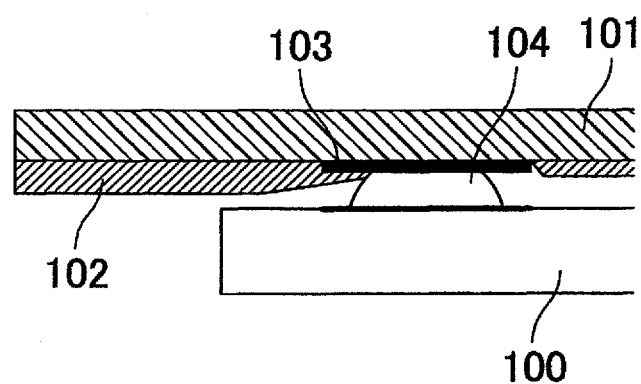
FIG. 10 is an enlarged view showing an edge portion of a conventional FPC that is connected to a piezoelectric actuator.

As discussed above with reference to FIG. 10, the formation of the insulating layer 65 (i.e., application of the liquid insulating material) with a constant thickness of the layer 65 in each edge portion 55a of the connection surface 56 of the substrate 55 is difficult as compared with that in the central portion of the connection surface 56, so that there is a risk that the insulating layer 65 might have a large thickness portion in each edge portion 55a. Described more specifically, in the present embodiment, the insulating layer 65 is formed by applying the liquid insulating material onto the connection surface 56 of the substrate 55, in a direction from left to right as seen in FIG. 6, i.e., in a direction away from the left-side edge 61 of the connection surface 56 toward the right-side edge 61 of the connection surface 56. The thickness of the thus formed insulating layer 65 could be increased in the right-side edge portion 55a of the connection surface 56 which is adjacent to the right-side edge 61 of the connection surface 56 and which extends along the right-side edge 61. Then, when the conductive adhesive forming each bump 53 is caused to shrink as a result of hardening shrinkage of the conductive adhesive, a portion of the substrate 55 positioned in the vicinity of the bump is deformed to be drawn toward the piezoelectric actuator 8. In this instance, the deformation of the portion of the substrate 55 is impeded whereby a large force is caused to act on the bump 53, thereby inducing a risk of breakage of the bump 53. In view of this, the present embodiment employs an arrangement that is designed to restrain increase of the thickness of the insulating layer 65 in the edge portions 55a.

Figure 7A:
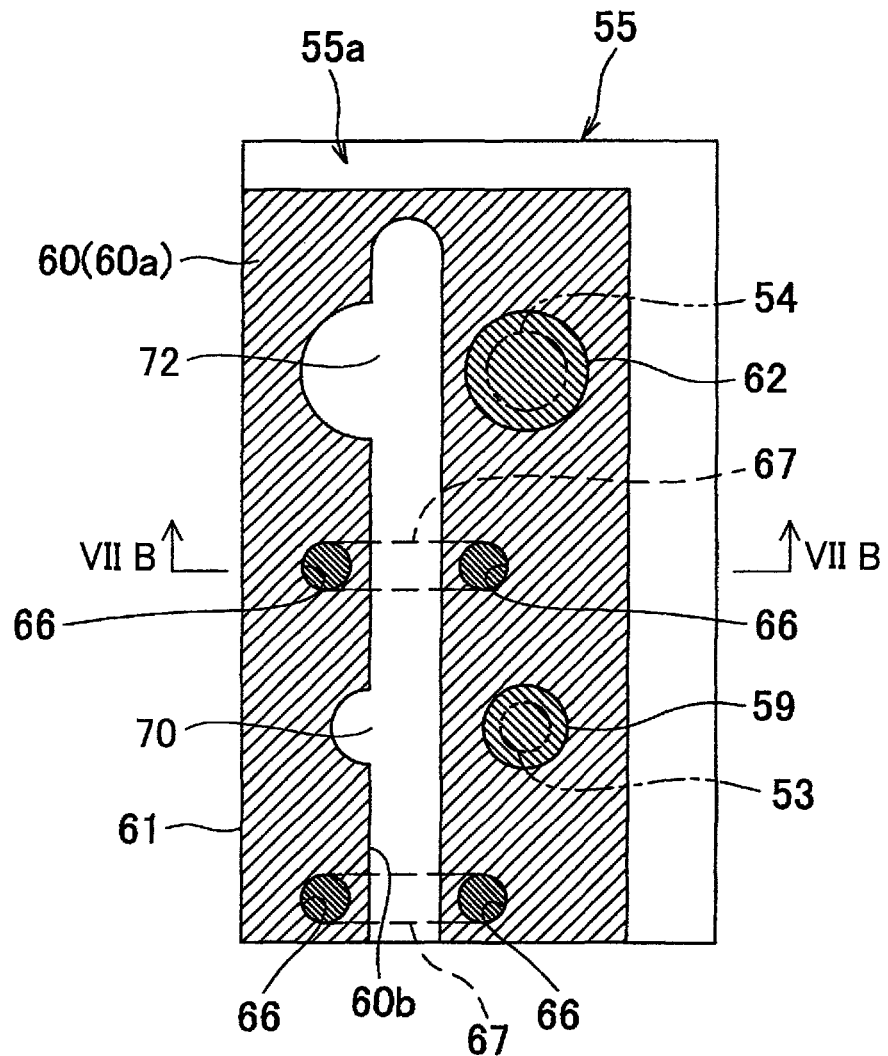
FIG. 7A is an enlarged view showing a part C in FIG. 6.
Figure 7B:
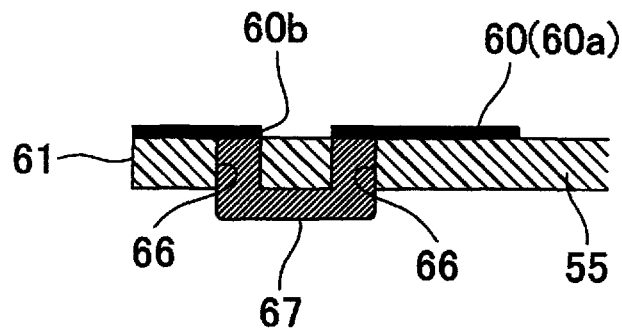
FIG. 7B is a cross sectional view taken along line VIIB-VIIB in FIG. 7A.

As shown in FIG. 6 (in which the insulating layer 65 is represented by hatching), FIG. 7A (in which the insulating layer 65 is not illustrated) and FIG. 7B, the second connecting electrode portions 59 (that are to be connected to the common electrode 44) and the third connecting electrode portions 62 (that serve to reinforce the connection of the piezoelectric actuator 8 and the FPC 48) are provided in the distal end portion 60a (i.e., large width portion) of each of the two second wires 60. The distal end portion 60a of each second wire 60 has a hole 60b serving as an example of conducive-material absent portion in which the conductive material forming the second wire 60 is absent, such that the hole 60b is located between the edge 61 of the substrate 55 and the connecting electrode portions 59, 62. In the present embodiment, the hole 60b is an elongated hole which is elongated along the edge 61 of the substrate 55 and which has an opening that opens in one of opposite surfaces of each second wire 60 that is remote from the substrate 55. The hole 60b of each second wire 60, which extends along the edge 61 of the substrate 55, has adjacent portions 70 each of which is adjacent to a corresponding one of the second connecting electrode portions 59, adjacent portions 72 each of which is adjacent to a corresponding one of the third connecting electrode portions 62 and also non-adjacent portions 71 each of which is not adjacent to any one of the connecting electrode portions 59, 62, as shown in FIG. 6. Each of the adjacent portions 70, 72 of the hole 60b has a width (as measured in a width direction of the elongated hole as the hole 60b) that is larger than a width of each of the non-adjacent portions 71 of the hole 60b. It is noted that the hole 60 may be referred also to as a recess provided in one of the opposite surfaces of each second wire 60 that is remote from the substrate 55. It is further noted that each of the adjacent portions 70, 72 may be referred also to as aligned portions each of which is substantially aligned with a corresponding one of the connecting electrode portions 59, 62, in a vertical direction as seen in FIG. 6.

Figure 8:
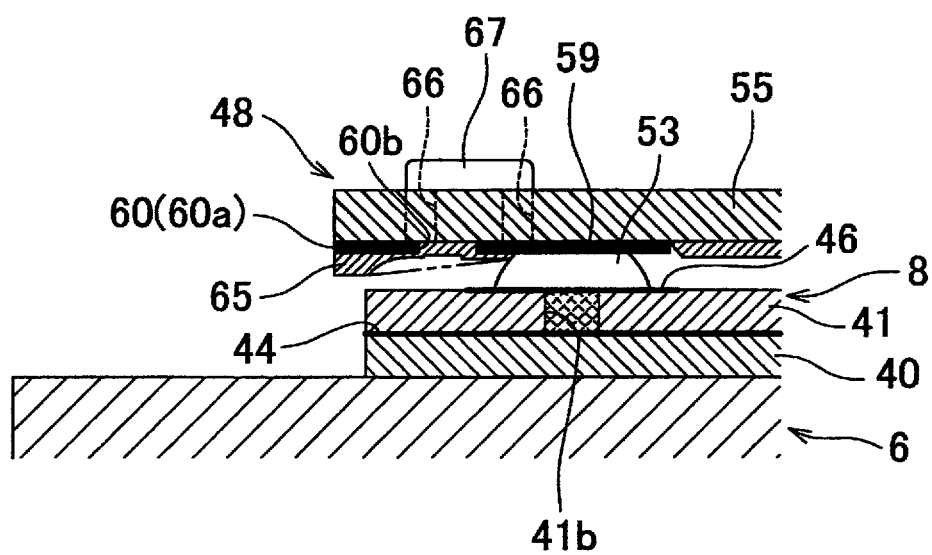
FIG. 8 is an enlarged view showing an edge portion of a substrate which is connected to the piezoelectric actuator via bumps.

Then, when the liquid insulating material is applied on the substrate 55 for forming the insulating layer 65, after formation of the second wires 60 on the substrate 55, an excess portion of the applied liquid insulating material is captured into the hole 60b, as shown in FIG. 8. Thus, the hole 60b is at least partially filled with the insulating material that constitutes the insulating layer 65. Therefore, it is possible to restrain increase of the thickness of the insulating layer 65 in a region defined between the edge 61 and the electrode portions 59, 62, as compared with an arrangement in which the hole 60b is not provided in each second wire 60 and in which the insulating layer 65 could be formed, as indicated by two-dot chain line in FIG. 8, in the region defined between the edge 61 and the electrode portions 59, 62. The presence of the distal end portion 60a of the second wire 60 formed of a conductive material and having a large width could be a factor impeding deformation of the edge portion 55a of the substrate 55. However, the presence of the hole 60b in the second wire 60 serves to alleviate the impediment against the deformation of the substrate 55.

Further, it is preferable that portions of the substrate 55, which are to be positioned in respective positions close to the respective bumps 53, 54, are largely deformable upon hardening shrinkage of the bumps 53, 54, without their deformation being impeded by the insulating layer 65. To this end, as shown in FIG. 7A, each of the above-described adjacent portions 70, 72 of the hole 60b, which is adjacent to a corresponding one of the connecting electrode portions 59, 62, extends toward the edge 61 by a short distance so as to have a width larger than a width of the non-adjacent portions 71 of the hole 60b. Owing to this arrangement, an excess portion of the applied liquid insulating material in the edge portion 55a can be reliably captured into the hole 60, so that it is possible to effectively restrain the impediment against the deformation of the portions of the substrate 55 which are positioned in the vicinity of the bumps 53, 54.

Each bump is caused to shrink when being hardened by heat, and an amount of the shrinkage is increased with increase in a size of the bump. Therefore, a portion of the substrate 55, which is to be positioned in a position close to each bump, is required to be deformable by a larger amount when the bump is large in size than the bump is small in size. In view of this, as shown in FIGS. 6 and 7A, each of the adjacent portions 72 of the hole 60b adjacent to the respective third connecting electrode portions 62 has a width larger than a width of each of the adjacent portions 70 of the hole 60b adjacent to the respective second connecting electrode portions 59, because the size of each of the bumps 54 that are to be connected to the respective third connecting electrode portions 62 is larger than the size of each of the bumps 53 that are to be connected to the respective second connecting electrode portions 59.

As shown in FIGS. 7A, 7B and 8, the substrate 55 has a plurality of pairs of through-holes 66 provided in the edge portions 55a in which the distal end portions 60a of the second wires 60 are provided. Each pair of the through-holes 66 consists of two through-holes 66 that are located in respective opposite sides of a corresponding one of the above-described non-adjacent portions 71 of the hole 60b each of which is not adjacent to any one of the connecting electrode portions 59, 62. Each of the two through-holes 66 is filled with an electrically conductive material that is received therein. The two through-holes 66 are bridged or connected by a conductive bridge or jumper 67 provided on a surface of the substrate 55 which is opposite to the above-described connection surface 56, i.e., on one of opposite side surfaces of the substrate 55 which is remote from the second wire 60, such that the conductive material received in one of the two through-holes 66 has electrical continuity with the conductive material received in the other of the two through-holes 66 via the conductive jumper 67. It is noted that the quantity of the conducive jumpers 67 is not limited to a particular number. For example, the conductive jumpers 67 may be provided such that, between each adjacent pair of the connecting electrode portions 59, 62 that are arranged along each edge 61 of the substrate 55 at a distance interval, a corresponding one of the jumpers 67 is located.

The electric resistance in the second wire 60 could be increased by reduction of area or volume of the second wire 60b due to the provision of the hole 60b in the distal end portion 60a of the second wire 60. However, owing to the conductive jumpers 67 which are provided on a side of the substrate 55 remote from the second wire 60 and which bridge over the hole 60b, it is possible to restrain such an increase of the electrical resistance in the second wire 60. Further, the through-holes 66 filled with the conductive material and the conductive jumpers 67 made of the conductive material are provided in positions not adjacent to the connecting electrode portions 59, 62, the deformation of the portions of the substrate 55 which are positioned in the vicinity of the bumps 53, 54, upon hardening shrinkage of the bumps 53, 54, is little impeded by the presence of these conductive materials.

There will be described a process of manufacturing the above-described FPC 48.

The manufacturing process is initiated with a first pattern forming step of forming the first connection electrode portions 57 and the first wires 58 on the connection surface 56 of the substrate 55 (at which the FPC 48 is to be connected to the piezoelectric actuator 8), such that the first wires 58 have electrical continuity with the respective first connection electrode portions 57, as shown in FIG. 6.

Further, a second pattern forming step is implemented to form the second connection electrode portions 59 and the second wires 60 on the connection surface 56 of the substrate 55, such that the second wires 60 have electrical continuity with the second connection electrode portions 59, as shown in FIG. 6. Specifically described, in this second pattern forming step, the distal end portions 60a of the second wires 60 are formed on the respective edge portions 55a of the substrate 55, and the second connecting electrode portions 69 are formed in the distal end portion 60a of each of the second wires 60. Further, the third connecting electrode portions 62, which are to be connected to the respective reinforcement bumps 54, are formed in the distal end portion 60a of each of the second wires 60. Moreover, in the distal end portion 60a of each of the second wires 60, the hole 60b (in which the conducive material is absent) is formed such that the hole 60b is located between a corresponding one of the edges 61 of the substrate 55 and the connecting electrode portions 59, 62 and has an elongated shape extending along the corresponding edge 61. In the present embodiment, the hole 60b is formed such that each of the above-described adjacent portions 70, 72 (which is adjacent to a corresponding one of the connecting electrode portions 59, 62) has a width larger than a width of each of the non-adjacent portions 71 of the hole 60b (which is not adjacent to any one of the connecting electrode portions 59, 62), as shown in FIGS. 6 and 7A.

It is noted that the above-described first and second pattern forming steps may be implemented concurrently with each other, for example, by a screen printing.

Meanwhile, the plurality of pairs of through-holes 66 are formed in the edge portions 55a of the substrate 55 such that each pair of the through-holes 66 consists of two through-holes 66 that are located in respective opposite sides of a corresponding one of the above-described non-adjacent portions 71 of the hole 60b. Then, the conductive material is introduced into each of the through-holes 66, and the conductive jumpers 67 are provided on the surface of the substrate 55 which is opposite to the above-described connection surface 56 such that the conductive material introduced in one of each two through-holes 66 has electrical continuity with the conductive material introduced in the other of the two through-holes 66 via the corresponding conductive jumper 67. It is noted that the formation of the through-holes 66 in the substrate 55 may be made prior to the above-described second pattern forming step. In this case, in the second pattern forming step, the conductive material may be introduced into the through-holes 66 when the second connecting electrode portions 59 and the second wires 60 are formed by a screen printing or the like. It is further noted that the conductive jumpers 67 may be formed by applying the conductive material onto the above-described surface of the substrate 55 opposite to the connection surface 56, by means of a suitable printing or the like.

After implementation of the first and second pattern forming steps, a coating step is implemented to apply the liquid insulating material (e.g., solder resist) on the connection surface 56 of the substrate 55, with a masking cover (not shown) being disposed on the connection surface 56 to cover the first, second and third connection electrode portions 57, 59, 62. Thus, by implementation of the coating step, the connection surface 56 of the substrate 55 is coated with the insulating layer 65 such that the first and second wires 58, 60 are covered by the insulating layer 65 while the connection electrode portions 57, 59, 62 are exposed from the insulating layer 65.

In the coating step, even if some of the liquid insulating material is in excess in the edge portion 55a of the substrate 55 in which control of the thickness of the insulating layer 65 is difficult, namely, even if the insulating material has an excess portion in the edge portion 55a, such an excess portion of the insulating material is captured into the hole 60b that is formed in the distal end portion 60a of the second wire 60, thereby making it possible to restrain undesirable increase of the thickness of the insulating layer 65 in the edge portion 55a of the substrate 55. Further, since the width of the hole 60b is made larger in its adjacent portions 70, 72 adjacent to the respective connecting electrode portions 59, 62, the excess portion of the insulating material is reliably captured in the hole 60b, thereby permitting large deformation of each of the portions of the substrate 55 that are in the vicinity with the respective bumps 53, 54.

There will be described various modifications of the above-described embodiment. In the following description, the same reference numerals as used in the above-described embodiment will be used to identify the same or similar elements, and redundant description of these elements will not be provided.

1) In the above-described embodiment, the hole 60b provided in each second wire 60 is an elongated hole that is elongated along the corresponding edge 61 of the substrate 55. However, the hole 60b does not necessarily have to be constituted by the elongated hole but may be constituted by a plurality of holes each of which is located in respective portions of the large width portion 60a of each second wire 60, which are adjacent to the respective connecting electrode portions 59, 62. Further, in the above-described embodiment, each of the adjacent portions 70, 72 of the hole 60b, which are adjacent to the respective connecting electrode portions 59, 62, extends slightly toward the edge 61 so as to have a width larger than a width of the non-adjacent portions 71 of the hole 60b. However, the width of each of the adjacent portions 70, 72 of the hole 60b does not have to be larger than the width of each of the non-adjacent portions 71 of the hole 60b. For example, the hole 60b may be constituted by an elongated hole extending along the corresponding edge 61 and having a width that is constant as viewed in the direction in which the elongated hole is elongated. Further, the hole 60b may be constituted by an elongated hole that penetrates through a distal end of the substrate 55 (i.e., an upper end of the substrate 55 as seen in FIG. 6) or a may be constituted by a groove or recess that opens only in one of the opposite side surfaces of the second wire 60 which is remote from the substrate 55, i.e., a surface of the second wire 60 which is to be opposed to the upper surface of the piezoelectric actuator 8.

2) In the above-described embodiment, each of the third connecting electrode portions 62, which is to be connected to the reinforcement bump 54 (that is larger in size than the bumps 52, 53), does not have electrical continuity with any electrode that serves to drive the piezoelectric actuator 8. However, each third connecting electrode portion 62 may have electrical continuity with the electrode serving to drive the piezoelectric actuator 8. For example, like each second connecting electrode portion 59, each third connecting electrode portions 62 may be an electrode portion that is to be connected via the bump to the surface electrode 46 having electrical continuity with the common electrode 44.

Figure 9:
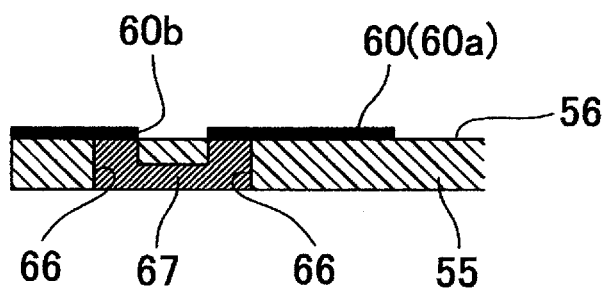
FIG. 9 is a cross sectional view of an edge portion of FPC according to a modification of the embodiment.

3) In the above-described embodiment, each conductive jumper 67, which is provided to bridge over the hole 60b of the second wire 60, is disposed on the surface of the substrate 55 that is opposite to the above-described connection surface 56 (on which the second wires 60 are formed), as shown in FIG. 7B. However, each conductive jumper 67 may be embedded in the surface of the substrate 55 that is opposite to the connection surface 56, as shown in FIG. 9.

4) The conductive jumpers 67 are not essential but may be omitted. The conductive jumpers 67 serve to restrain the electrical resistance in each second wire 60 from being increased by the presence of the hole 60b. Thus, the absence of the conductive jumpers 67 provides a disadvantage that the electric resistance in each second wire 60 could be somewhat increased. However, the absence of the conductive jumpers 67 provides an advantage that the conductive material constituting the conductive jumpers 67 and the conductive material received in the through-holes 66 are no longer located in the portions of the substrate 55 that are in the vicinity with the respective bumps 53, 54 so that deformations of these portions of the substrate 55 would be much less impeded. Further, in the absence of the conductive jumpers 67, it is possible to eliminate steps of forming the through-holes 66 and the conductive jumpers 67 as such, thereby providing another advantage from a point of view of the manufacturing cost.

5) The present invention is applicable not only to a wiring board that is to be connected to a piezoelectric actuator but also to a wiring board that is to be used for an actuator other than the piezoelectric actuator, as long as the actuator has a plurality of individual electrodes and at least one common electrode that is common to all of the individual electrodes.

Further, the present invention is applicable not only to an actuator that is to be used for an inkjet head but also to an actuator that is to be used for any device other than the inkjet head.

What is claimed is:

1. A wiring board, which is to be connected to a plurality of individual-electrode connection terminals and at least one common-electrode connection terminal that are disposed on a surface of an actuator having a plurality of individual electrodes and at least one common electrode, the plurality of individual-electrode connection terminals being provided for the respective individual electrodes, and the at least one common-electrode connection terminal being provided for the at least one common electrode, said wiring board comprising:
    a flexible substrate which has an opposed surface that is to be opposed to the surface of the actuator, and which is made of an insulating material;
    a plurality of first connection electrode portions which are disposed on said opposed surface of said flexible substrate, and which are to be connected to the plurality of individual-electrode connection terminals of the actuator via first bumps each made of a conductive adhesive;
    a plurality of first wires each of which is made of a conductive material, said first wires having electrical continuity with said plurality of first connection electrode portions;
    at least one second connecting electrode portion which is disposed on said opposed surface of said flexible substrate, and which is to be connected to the at least one common-electrode connection terminal of the actuator via at least one second bump each made of a conductive adhesive; and
    a second wire which is made of a conductive material, said second wire having electrical continuity with said at least one second connecting electrode portion and including a large width portion having a width larger than a width of each of said first wires,
    wherein said at least one second connecting electrode portion is provided in said large width portion of said second wire, such that said at least one second connecting electrode portion and said large width portion are located in an edge portion of said flexible substrate,
    wherein said opposed surface of said flexible substrate is coated with an insulating layer, such that said plurality of first wires and said second wire are covered by said insulating layer, and such that said plurality of first connection electrode portions and said at least one second connecting electrode portion are exposed from said insulating layer,
    wherein said large width portion of said second wire has a conductive-material absent portion in which the conductive material constituting said second wire is absent, such that said conducive-material absent portion is located between an edge of said flexible substrate and at least one of said at least one second connecting electrode portion, and
    wherein said insulating layer includes a portion located in said conductive-material absent portion.

2. The wiring board according to claim 1, wherein said conducive-material absent portion is a hole provided in said large width portion of said second wire.

3. The wiring board according to claim 2, wherein said hole has an opening that opens in one of opposite surfaces of said second wire that is remote from said flexible substrate.

4. The wiring board according to claim 1, wherein said conducive-material absent portion is a recess provided in one of opposite surfaces of said second wire that is remote from said flexible substrate.

5. The wiring board according to claim 1,
    wherein said at least one second connecting electrode portion consists of a plurality of second connecting electrode portions that are arranged in a given direction, and
    wherein said insulating layer is a layer formed by applying, in a direction intersecting said given direction, a liquid insulating material onto on said opposed surface of said flexible substrate on which said plurality of first wires and said second wire are disposed.

6. The wiring board according to claim 1,
    wherein said conducive-material absent portion is an elongated hole which is elongated along said edge of said flexible substrate, wherein said elongated hole has at least one adjacent portion which is adjacent to said at least one second connecting electrode portion, and
    wherein said at least one adjacent portion of said elongated hole has a width larger than a width of a portion of said elongated hole which is other than said at least one adjacent portion.

7. The wiring board according to claim 1,
    wherein said at least one second connecting electrode portion consists of a plurality of second connecting electrode portions that are arranged in a given direction, and
    wherein said conducive-material absent portion is an elongated hole which is elongated in said given direction.

8. The wiring board according to claim 1,
    wherein said second wire extends along said edge of said flexible substrate, and
    wherein said conducive-material absent portion is an elongated hole elongated in a direction in which said second wire extends.

9. The wiring board according to claim 6, wherein said at least one adjacent portion of said elongated hole is located between said edge of said flexible substrate and said at least one second connecting electrode portion which is adjacent to said at least one adjacent portion.

10. The wiring board according to claim 6, further comprising a third connecting electrode portion which is provided in said large width portion of said second wire and which is to be connected to the surface of the actuator via a third bump having a contact surface that is to be held in contact with said third connecting electrode portion, the contact surface of the third bump being larger than a contact surface of each of the at least one second bump that is to be held in contact with a corresponding one of said at least one second connecting electrode portion, wherein said elongated hole is located between said edge of said flexible substrate and said third connecting electrode portion as well as between said edge and said at least one second connecting electrode portion, and has another adjacent portion adjacent to said third connecting electrode portion, and wherein said another adjacent portion of said elongated hole adjacent to said third connecting electrode portion has a width larger than said width of said at least one adjacent portion adjacent to said at least one second connecting electrode portion.

11. The wiring board according to claim 10, wherein said third connecting electrode portion is to be connected, via the third bump, to a non-continuity portion of the surface of the actuator which has no electrical continuity with the common electrode.

12. The wiring board according to claim 1, wherein said flexible substrate has two through-holes provided in said edge portion in which said large width portion of said second wire is located, such that said two through-holes are located in respective opposite sides of said conducive-material absent portion of said large width portion, and wherein said two through-holes are connected by a conductive jumper provided on one of opposite sides of said flexible substrate which is remote from said second wire, such that a conductive material received in one of said two through-holes has electrical continuity with a conductive material received in the other of said two through-holes via said conductive jumper.

13. The wiring board according to claim 12, wherein said conducive-material absent portion is an elongated hole which is elongated along said edge of said flexible substrate and which has at least one adjacent portion which is adjacent to said at least one second connecting electrode portion, and wherein said conductive jumper extends in a direction of a width of said elongated hole, and bridges over a portion of said elongated hole which is other than said at least one adjacent portion.

14. The wiring board according to claim 2, wherein said hole provided in said large width portion of said second wire is at least partially filled with an insulating material that constitutes said insulating layer.

15. A process of manufacturing a wiring board which is structured to connect to a plurality of individual-electrode connection terminals and at least one common-electrode connection terminal that are disposed on a surface of an actuator having a plurality of individual electrodes and at least one common electrode, the plurality of individual-electrode connection terminals being provided for the respective individual electrodes, and the at least one common-electrode connection terminal being provided for the at least one common electrode, said process comprising:

forming a plurality of first connection electrode portions and a plurality of first wires, each of which is made of a conductive material, onto an opposed surface of a flexible substrate that is made of an insulating material, such that said plurality of first connection electrode portions are structured to connect to the plurality of individual-electrode connection terminals of the actuator via first bumps each made of a conductive adhesive, and such that said plurality of first wires have electrical continuity with said plurality of first connection electrode portions, wherein the opposed surface of said flexible substrate is structured to oppose the surface of the actuator;

forming at least one second connecting electrode portion and a second wire, which is made of a conductive material, onto said opposed surface of said flexible substrate, such that said at least one second connecting electrode portion is structured to connect to the at least one common-electrode connection terminal of the actuator via at least one second bump each made of a conductive adhesive, such that said second wire has electrical continuity with said at least one second connecting electrode portion and includes a large width portion having a width larger than a width of each of said first wires, such that said at least one second connecting electrode portion is provided in said large width portion of said second wire, such that said at least one second connecting electrode portion and said large width portion are located in an edge portion of said flexible substrate, such that said large width portion of said second wire has a conducive-material absent portion in which the conductive material constituting said second wire is absent, and such that said conducive-material absent portion is located between an edge of said flexible substrate and at least one of said at least one second connecting electrode portion; and coating said opposed surface of said flexible substrate with an insulating layer by applying an insulating material onto said opposed surface of said flexible substrate after said plurality of first connection electrode portions, said plurality of first wires, said at least one second connecting electrode portion, and said second wire have been formed on said opposed surface of said flexible substrate, such that said plurality of first wires and said second wire are covered by said insulating layer, and such that said plurality of first connection electrode portions and said at least one second connecting electrode portion are exposed from said insulating layer.

16. The process according to claim 15, wherein said opposed surface of said flexible substrate is coated with said insulating layer by applying a liquid material as the insulating material onto said opposed surface of said flexible substrate in a direction intersecting a direction in which a plurality of second connecting electrode portions as said at least one second connecting electrode portion are arranged.

* * * * *